(12) United States Patent
Speer

(10) Patent No.: US 9,577,169 B2
(45) Date of Patent: Feb. 21, 2017

(54) LED LEAD FRAME FOR LAMINATED LED CIRCUITS

(71) Applicant: Richard Speer, Concord, MA (US)

(72) Inventor: Richard Speer, Concord, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 0 days.

(21) Appl. No.: 14/075,122

(22) Filed: Nov. 8, 2013

(65) Prior Publication Data
US 2015/0129899 A1    May 14, 2015

(51) Int. Cl.
*H01L 33/62* (2010.01)
*H01L 27/15* (2006.01)
*H01L 33/00* (2010.01)
*H01L 33/60* (2010.01)
*H05K 3/20* (2006.01)
(Continued)

(52) U.S. Cl.
CPC ............. *H01L 33/62* (2013.01); *H01L 27/15* (2013.01); *H01L 33/005* (2013.01); *H01L 33/60* (2013.01); *H05K 3/202* (2013.01); *H05K 3/281* (2013.01); *H05K 3/303* (2013.01); *H01L 2924/0002* (2013.01); *H01L 2933/0033* (2013.01); *H01L 2933/0066* (2013.01); *H05K 1/189* (2013.01); *H05K 2201/1053* (2013.01); *H05K 2201/10106* (2013.01); *H05K 2201/10113* (2013.01);
(Continued)

(58) Field of Classification Search
CPC ...... H01L 33/005; H01L 33/647; H01L 27/15; H01L 33/62; H01L 33/60; H01L 33/486; H01L 2933/0066; H01L 2933/0033; H05K 3/303; H05K 3/202; H05K 2201/1053; H05K 2201/10537; H05K 2201/10113; H05K 2201/10106; H05K 1/189
USPC .............. 257/88, 79, 98, 99; 438/27, 28, 34
See application file for complete search history.

(56) References Cited

U.S. PATENT DOCUMENTS 5,404,282 A * 4/1995 Klinke ...................... F21K 9/00
257/E25.028
8,235,551 B2 * 8/2012 Lin et al. .................. 362/249.04
(Continued)

FOREIGN PATENT DOCUMENTS

WO        2013066920 A2    5/2013

OTHER PUBLICATIONS

Abad Mesa, Begona, International Search Report and Written Opinion of the International Searching Authority, Feb. 4, 2015, pp. 1-9, European Patent Office, Rijswijk, The Netherlands.

*Primary Examiner* — David Vu
(74) *Attorney, Agent, or Firm* — Edward S. Podszus

(57) ABSTRACT

Techniques are disclosed for integrating the LED lead frame into the LED circuit fabrication process. The LED packages within the lead frame may be spaced according to the final spacing of the LED packages on the finished circuit board, such that multiple LED packages may be attached to a circuit board at a time by applying the lead frame to circuit board and then removing portions of the lead frame, leaving the LED packages attached to the board. The LED packages may be attached using solder or conductive epoxy, in some embodiments. Alternatively, part of the lead frame may include conductive wires forming one or more strings of LED packages. An entire string of LED packages may then be removed from the lead frame in a single motion and (Continued)

placement may be performed for a string of LED packages all at once rather than for individual LED packages.

18 Claims, 5 Drawing Sheets

(51) Int. Cl.
  *H05K 3/28* (2006.01)
  *H05K 3/30* (2006.01)
  *H05K 1/18* (2006.01)
(52) U.S. Cl.
  CPC .............. *H05K 2201/10537* (2013.01); *H05K 2203/063* (2013.01); *Y02P 70/613* (2015.11)

(56) References Cited

U.S. PATENT DOCUMENTS

| | | |
|---|---|---|
| 2003/0002282 A1 | 1/2003 | Swaris et al. |
| 2007/0156208 A1* | 7/2007 | Havell ................ A61N 5/0616 607/88 |
| 2010/0149806 A1 | 6/2010 | Yiu |

* cited by examiner

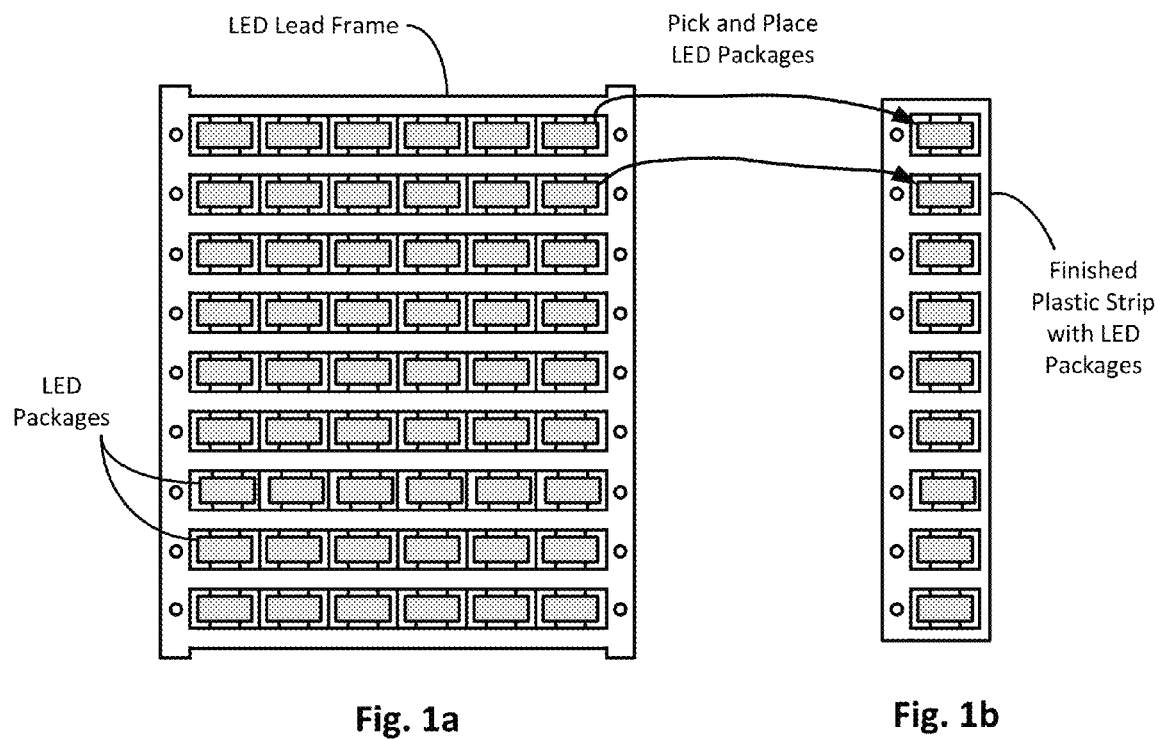
Fig. 1a
Fig. 1b
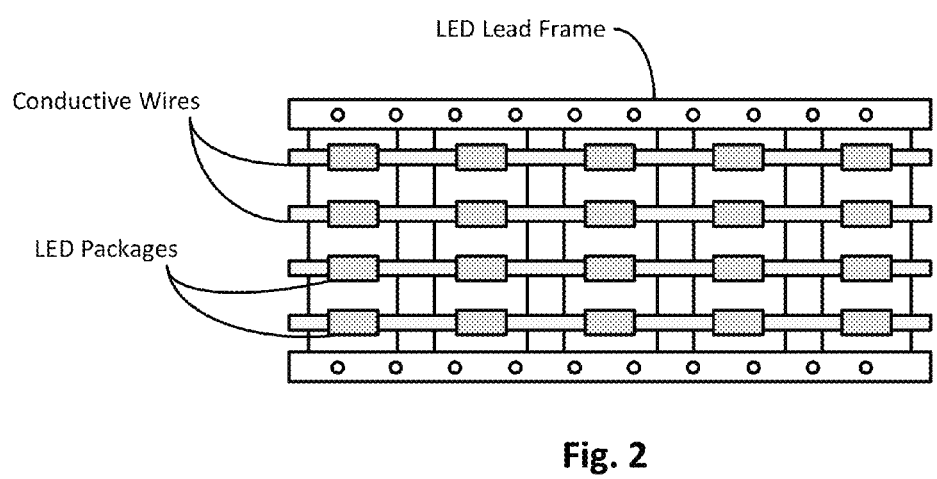
Fig. 2

LED LEAD FRAME FOR LAMINATED LED CIRCUITS

FIELD OF THE DISCLOSURE

This disclosure relates to circuit fabrication, and more specifically to chip attachment and lead frame design.

BACKGROUND

In the fabrication and installation of LED packages, chip attachment and wire bonding are done on a lead frame. In some cases, each LED package can be removed from the lead frame and placed onto a final plastic reel for sale and later attachment to a circuit board. Designing lead frames for the efficient attachment of LED packages to circuit boards involves a number of non-trivial challenges.

BRIEF DESCRIPTION OF THE DRAWINGS

FIGS. 1a-b show an LED lead frame and finished plastic strip including multiple LED packages.

FIG. 2 shows an example lead frame including LED packages connected in series along multiple conductive wires, according to an embodiment of the present invention.

DETAILED DESCRIPTION

Figure 3:
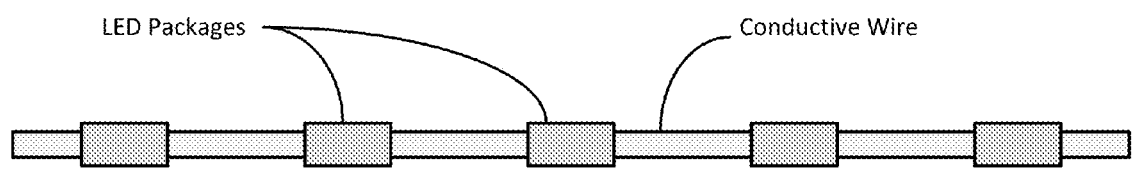
FIG. 3 shows a string of LED packages attached to a conductive wire, according to one embodiment of the present invention.

Techniques are disclosed for integrating an LED lead frame into an LED circuit fabrication process. In some embodiments, the LED packages within the lead frame may be spaced according to the final spacing of the LED packages on the finished circuit board, such that multiple LED packages may be simultaneously attached to a circuit board by applying the lead frame to circuit board and then removing portions of the lead frame, leaving the LED packages attached to the board. The LED packages may be attached using solder or conductive epoxy, in some embodiments. Alternatively, part of the LED package lead frame may be incorporated into the final circuit board, in some embodiments. In one such example, the lead frame includes conductive wires forming one or more strings of LED packages and an entire string of LED packages may be removed from the lead frame in a single or otherwise continuous motion. One or more strings of LED packages may then be attached to a circuit board at one time, either onto the board or laminated within a flexible circuit board, rather than removing and placing each individual LED package.

General Overview

As previously explained, in the manufacturing process of producing LED packages, the chip attachment and wire bonding are done on a lead frame. In some cases, after manufacturing, each LED package may be removed from the lead frame and placed onto a plastic reel for sale, or placed onto the final circuit board. The lead frames may be designed for manufacturing the LED packages, which are then sold in plastic strips for later attachment to a circuit board or light engine. The linear density of the LED packages within the lead frame may reduce the overall time for chip attachment and wire bonding, in some cases, because the targets for the machinery are close together and there is minimal travel time between each chip. Thus, many lead frames attempt to pack the highest possible number of LED packages within a given area. However, removing each finished package from the lead frame and placing it individually into a plastic reel a final circuit board is repetitive and time consuming.

Thus, in accordance with an embodiment of the present invention, techniques are disclosed for integrating an LED lead frame in the LED circuit fabrication process. In one specific example, the lead frame would incorporate the physical dimensions of the final LED circuit or light engine, such that there would not have to be any additional conductive bonding or individual package placement into a distributed array of LEDs. The lead frame may include, for example, the LED packages connected in series along a copper strip such that an entire string of LED packages may be removed from the lead frame in one motion, and placement may be performed for a string of LED packages all at once rather than for individual LED packages. In one such example, when populating a light engine with LED packages, the copper strip portion of the lead frame may be kept intact and one or more strings of LED packages may be placed at a time. In such embodiments, because the LED placement on the lead frame is based on the final location of the LED packages, the linear density of the packages within the lead frame may be decreased and an increased travel time through the chip and wire-bonding machine may be needed to populate the same number of packages. In such embodiments, the length of each strip could depend on the size of the LED circuit pattern as well as the driver voltage requirements, which would determine how many LEDs in series one would desire. In other embodiments a lead frame could include any number of LEDs in series and each strip may be cut based on the desired length and number of LEDs.

In one embodiment, the series string design may be assembled inexpensively into a ply of flexible material, such as polyethylene terephthalate (PET), in a laminating process. The laminating material may be highly reflective, in some embodiments, with the top piece having preformed holes to allow the LED packages to fit through them. The laminating rollers may have grooves or dimples so as not to damage the LED packages, in some embodiments. Although such strings of LED packages require alignment and placement accuracy, in some embodiments there would be fewer final assembly steps than individually placing each LED package. For example, three strings each containing 100 LED packages may be attached on a circuit instead of placing 300 individual LED packages and making 600 solder/epoxy joints. In one specific example embodiment, challenges related to bonding LED packages to a flexible substrate may be significantly reduced using the techniques described above.

In other embodiments, the lead frame may include the LED packages spaced as they would be in the final circuit board but without being connected in series strings. In such an example, the entire lead frame may be placed above a circuit board and attached using the appropriate adhesives for each package. In such an embodiment, once the LED packages have been attached to the circuit board, unattached portions of the lead frame may be peeled away or otherwise removed, leaving behind the attached LED packages. In some embodiments, the external structure of the lead frame is peeled away, breaking the connections attaching the LED packages to the lead frame structure, and leaving behind the LED packages. Thus, all the LED packages in a lead frame may be attached to the circuit board or light engine at once, in some embodiments.

In one example embodiment, the circuit board may be a flexible laminated circuit board with conductive traces screen printed on the lower laminate sheet and perforations in the upper laminate sheet exposing the areas where the LED packages are to be attached. In some embodiments, the LED packages may be attached to the underlying circuit board using solder, a conductive epoxy, or any other suitable conductive adhesive. As will be appreciated, the techniques disclosed may be used for attaching any surface mount device to a circuit board and may incorporate more complicated circuit patterns, including LEDs connected in parallel, into the lead frame design. However, for ease of description examples are provided for attaching LED packages onto an LED circuit board.

LED Lead Frame Examples

FIGS. 1a-b show an LED lead frame and finished plastic strip including multiple LED packages. FIG. 1a shows the LED lead frame with a high linear density of LED packages. In this particular example, each LED package is picked and placed onto a finished plastic strip or reel, shown in FIG. 1b, which may be rolled up or otherwise packaged for final sale to a customer. A final pick and place step must be performed once the LED packages are placed in the finished plastic strip or reel in order to remove the LED packages from the strip and place them on the final circuit board.

FIG. 2 shows an example lead frame including LED packages connected in series along multiple conductive wires, according to an embodiment of the present invention. As can be seen, portions of the lead frame include the strings of LED packages on conductive wires, and these portions of the lead frame remain intact in order to efficiently attach an entire string of LED packages at one time, in some embodiments. The length of each string, as well as the number and placement of LED packages within the string, may depend, for example, on the size and pattern of the final LED circuit as well as the LED driver voltage requirements. In some embodiments, each LED string may be peeled or otherwise removed from the lead frame and attached to a substrate, while in other embodiments the LED strings may be attached to a substrate while still connected to the lead frame and portions of lead frame may then be removed leaving only the LED packages and conductive wires on the substrate. Attaching an LED string to a circuit may include laminating the string between two laminate sheets or bonding the string to a flexible or rigid substrate, in some embodiments. In one embodiment, the conductive wires connecting the LED packages are an integral part of the lead frame, and the conductive wires may be copper wires, ribbons or sections of copper tape. As will be appreciated, various types of conductive wires, ribbons, or tapes made of various conductive materials may be used and the present disclosure is not limited to any particular type or shape of conductive material.

FIG. 3 shows a string of LED packages attached to a conductive wire, according to one embodiment of the present invention. In some embodiments, many LED packages may be fabricated in a single long string within a lead frame, and the string can be removed and cut to any desired length or number of LED packages. The desired length and number of LED packages in each string may be dependent on the desired DC voltage that the lighting driver would apply across the string, in some embodiments. In this particular example, the string is cut to a string of five LED packages for the eventual placement within a flexible laminated circuit board. Once the strips are cut to length, they may be attached or laminated to a piece of flexible material (e.g., PET), in some embodiments.

Figure 4:
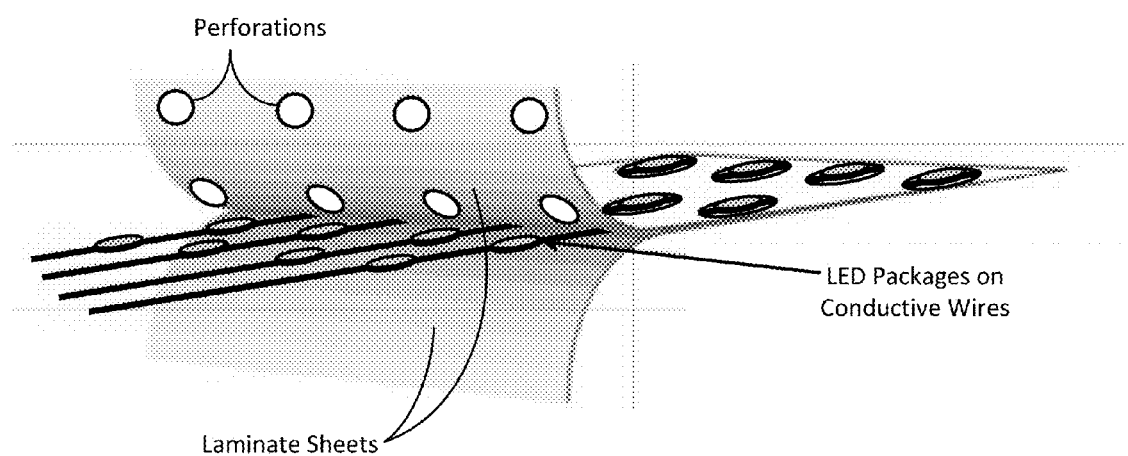
FIG. 4 shows four strings of LED packages on conductive wires being laminated between two laminate sheets, according to an embodiment of the present invention.

FIG. 4 shows four strings of LED packages on conductive wires being laminated between two laminate sheets, according to an embodiment of the present invention. Once multiple strings of LED packages have been formed on conductive wires within the lead frame, they may be removed from the lead frame and laminated within a flexible laminated LED circuit. The conductive wires, in this embodiment, form an integral part of the lead frame prior to being removed from the structure of the frame. In this particular example, the upper laminate sheet includes perforations so that the upper laminate sheet does not cover the LED packages. As can be seen, the perforations in this example are circular; however, they may be oval, rectangular, or any other suitable shape, in other embodiments. In one example embodiment, the upper laminate sheet is a transparent plastic such PET, or other suitable polymer, while the lower laminate sheet has a reflective upper surface. In other embodiments, the upper laminate sheet may have a reflective upper surface. Although this particular example shows four strings of LED packages laminated between two sheets, other embodiments may include fewer or more strings of LED packages and the conductive wires may be any suitable conductive material.

Figure 5:
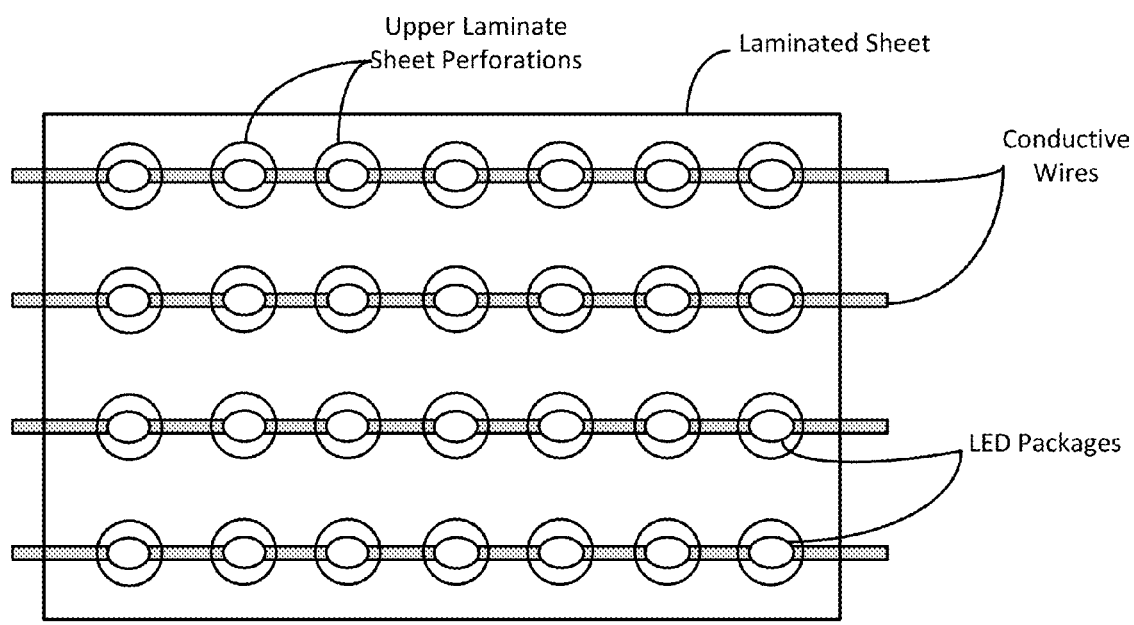
FIG. 5 shows a flexible laminated LED circuit, according to one embodiment of the present invention.

FIG. 5 shows a flexible laminated LED circuit, according to one embodiment of the present invention. As can be seen, the LED circuit includes four laminated strings of LED packages on copper wires. The upper laminate sheet in this particular embodiment is transparent and all of the copper wires are visible. Although this particular example shows four copper wires laminated between two sheets, other embodiments may include fewer or more copper wires and the copper wires may be replaced with any suitable conductive material. In one embodiment, making contact with the driver electronics could be done by directly attaching the lead frame metal with solder, or by clamping through the laminated sheet with pin contacts. In one embodiment, because at least one placement step is removed, the final LED package binning step may be removed also as the chips are binned before the packaging step. To summarize, the placement of LED packages may be simplified by removing the steps of: removing the LED package from the prior lead frame design, binning the finished package, placing the package into the finished plastic strip for sale, printing or etching a linear circuit board for individual LED packages, dispensing two amounts of bonding material (e.g., conductive epoxy or solder) to attach the LED packages, picking and placing the LED packages from the final plastic strip, curing or melting the bonding material.

Figure 6C:
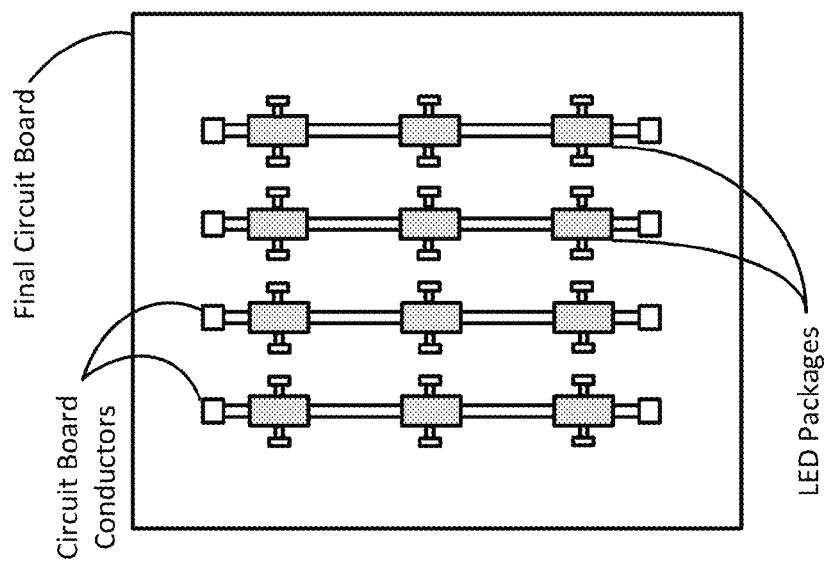
FIGS. 6a-c collectively illustrate the placement of LED packages over a circuit board, according to an embodiment of the present invention.
Figure 6B:
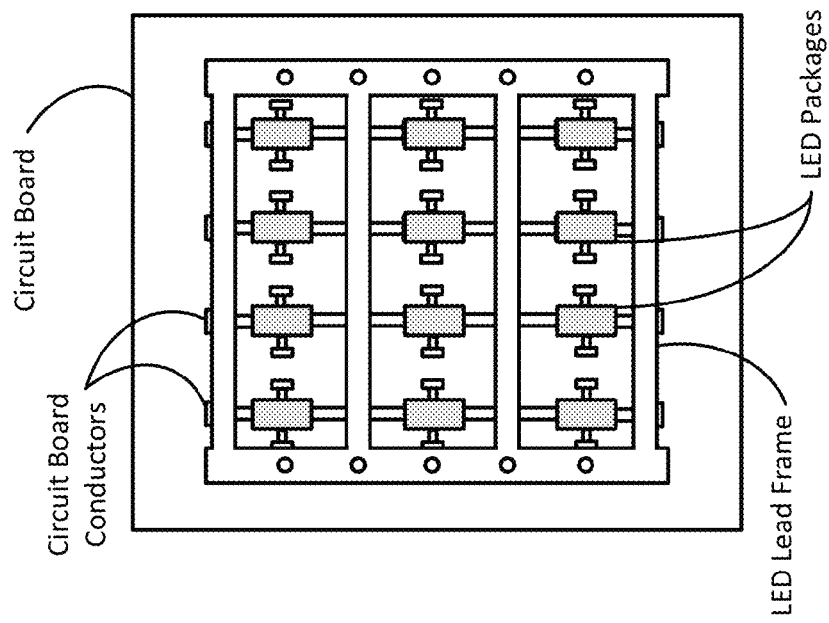
Figure 6A:
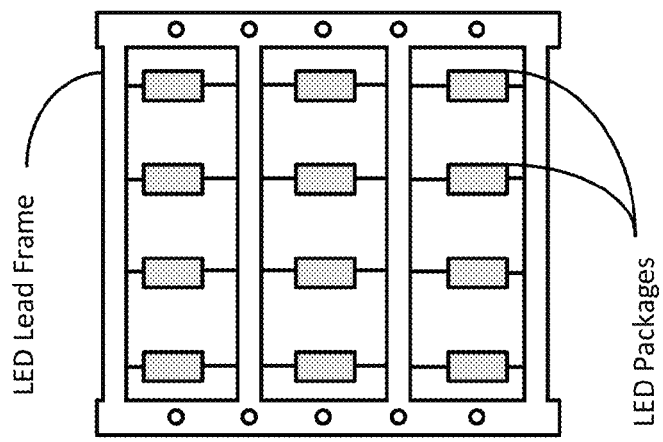

FIGS. 6a-c collectively illustrate the placement of LED packages over a circuit board, according to an embodiment of the present invention. As can be seen, the example lead frame shown in FIG. 6a includes multiple LED packages which are spaced on the lead frame as they will be in their final positions on the circuit board. FIG. 6b show the example LED lead frame of FIG. 6a positioned over a circuit board having circuit board conductors, such that the LED packages may be attached to the appropriate pads using solder or a conductive epoxy. In some embodiments, the circuit board conductors may be screen printed traces, metallic wires, metallic ribbons, or any suitable conductive material. In such an example embodiment, instead of requiring twelve pick-and-place actions to attach the LED packages to the circuit board, one action may attach all the LED packages at once while still attached to the lead frame. Once the solder has attached the LED packages or the epoxy has been cured, the frame portion of the LED lead frame may be removed, leaving the LED packages on the final circuit board attached to the circuit board conductors, as shown in the example of FIG. 6c. In some embodiments, the circuit board may be a flexible circuit board.

Methodology

Figure 7:
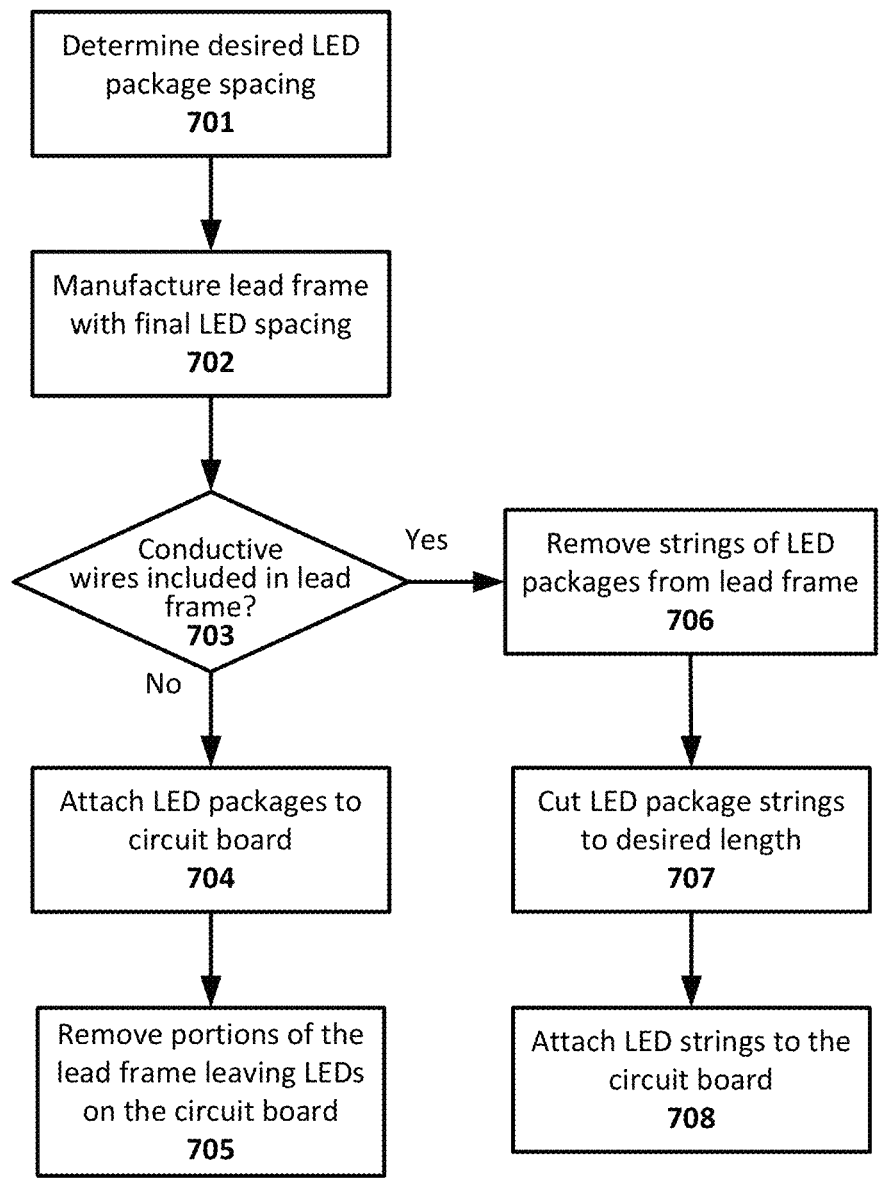
FIG. 7 illustrates a method for integrating the LED lead frame in the LED circuit fabrication process, according to an embodiment of the present invention.

FIG. 7 illustrates a method for integrating the LED lead frame in the LED circuit fabrication process, according to an embodiment of the present invention. The method may begin with determining 701 the desired LED package spacing. The spacing of the LED packages within the lead frame is determined, in some embodiments, based on the final LED package spacing for the finished lighting circuit. The method may continue with manufacturing 702 the lead frame with the final LED package spacing. The method may continue with determining 703 whether conductive wires are included as part of the lead frame. If the lead frame does not include conductive wires forming strings of LED packages, the method may continue with attaching 704 the LED packages to the circuit board. The LED packages may be attached to the circuit board while they are still within the lead frame by placing the lead frame over the circuit board. In some embodiments, solder or conductive epoxy may be used to attach the LED packages to the circuit board. The method may continue with removing 705 portions of the lead frame, leaving the LED packages attached to the circuit board. In one embodiment, the outer structure of the lead frame may be peeled away, breaking the connections attached to the LED packages and leaving the LED packages on the circuit board. If part of the lead frame includes conductive wires creating one or more strings of LED packages, the method may continue with removing 706 the strings of LED packages from the lead frame. The method may continue with cutting 707 the LED package strings to the desired length. In one embodiment, the length of the LED package string may be chosen based on the desired DC voltage that the lighting driver will apply across the string. The method may continue with attaching the strings of LED packages to the circuit board. In some embodiments, attaching the LED strings may include laminating the strings between two laminate sheets, while in other embodiments it may include attaching the string to a flexible or rigid circuit board.

Numerous embodiments will be apparent, and features described herein can be combined in any number of configurations. One example embodiment of the present invention provides an LED package lead frame. The lead frame includes a lead frame structure; and a plurality of LED packages connected within the lead frame structure, wherein the spacing of the LED packages within the lead frame structure corresponds to the final spacing of the LED packages within a final circuit arrangement. In some cases, the LED packages are attached to conductive wires within the lead frame structure using solder or conductive epoxy. In some such cases, the LED packages are attached to conductive wires forming a plurality of series strings of LED packages within the lead frame. In some such cases, the strings of LED packages are configured to remain intact when removed from the lead frame structure. In some cases, the LED packages are from a common bin. In some cases, the LED packages are configured to detach from the lead frame structure when the LED packages have been attached to a circuit board.

Another embodiment of the present invention provides a method of fabricating a circuit. The method includes determining LED package spacing of a final circuit arrangement. The method also includes fabricating an LED package lead frame wherein the spacing of LED packages within the lead frame structure corresponds to the final spacing of the LED packages within a circuit board. The method also includes attaching the LED packages to the circuit board by applying the LED package lead frame to the circuit board. In some cases, the method includes peeling away the lead frame structure leaving behind the LED packages attached to the circuit board. In some cases, the circuit board is a flexible circuit board. In some cases, at least one surface of the circuit board is made of a reflective material. In some cases, the LED packages are attached to the circuit board using solder or conductive epoxy. In some cases, the LED packages are attached to the circuit board using conductive epoxy, and wherein the method further comprises curing the epoxy.

Another embodiment of the present invention provides a method of fabricating a circuit. The method includes determining the LED package spacing of a final circuit arrangement. The method also includes forming a plurality of strings of LED packages by attaching LED packages to conductive wires within a lead frame structure, the spacing of the LED packages on the strings corresponds to the spacing of the final circuit arrangement. The method also includes removing the strings of LED packages from the lead frame structure. The method also includes attaching the strings of LED packages to a circuit board. In some cases, attaching the LED packages to conductive wires includes attaching the packages with solder or conductive epoxy. In some such cases, the LED packages are attached to the conductive wires with conductive epoxy, and the method further includes curing the epoxy. In some cases, attaching the strings of LED packages to a circuit board includes laminating the strings between an upper and a lower laminate sheet. In some such cases, the upper laminate sheet is a perforated laminate sheet and perforations of the upper laminate sheet leave the LED packages exposed. In other such cases, at least one of the upper laminate sheet and/or lower laminate sheet has a reflective surface. In some cases, the method includes cutting the strings of LED packages to a desired length prior to attaching them to a circuit board. In some cases, the LED packages are from a common bin.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A method of fabricating a circuit comprising:
   determining LED package spacing of a final circuit arrangement;
   fabricating an LED package lead frame wherein the spacing of LED packages within the lead frame corresponds to the final spacing of the LED packages within a circuit board; and
   attaching the LED packages to the circuit board by applying the LED package lead frame to the circuit board wherein the circuit board is a flexible sheet;

further comprising peeling away the lead frame leaving behind the LED packages attached to the circuit board.

2. The method of claim 1 wherein the LED packages are attached to conductive wires within the lead frame using solder or conductive epoxy.

3. The method of claim 1 wherein the LED packages are attached to conductive wires forming a plurality of series strings of LED packages within the lead frame.

4. The method of claim 3 wherein the strings of LED packages are configured to remain intact when removed from the lead frame.

5. The method of claim 1 wherein the LED packages are from a common bin.

6. The method of claim 1 wherein the LED packages are configured to detach from the lead frame structure when the LED packages have been attached to the circuit board.

7. The method of claim 1 wherein at least one surface of the circuit board is made of a reflective material.

8. The method of claim 1 wherein the LED packages are attached to the circuit board using solder or conductive epoxy.

9. The method of claim 1 wherein the LED packages are attached to the circuit board using conductive epoxy, and wherein the method further comprises curing the epoxy.

10. The method of claim 1 wherein attaching the LED packages to the circuit board comprises laminating the LED packages between an upper laminate sheet and a lower laminate sheet.

11. The method of claim 10 wherein the laminating is carried out with laminating rollers that have grooves or dimples so as not to damage the LED packages during the laminating.

12. A method of fabricating a circuit comprising:
forming a plurality of strings of LED packages by attaching LED packages to conductive wires within a lead frame structure, wherein spacing of the LED packages on the strings corresponds to spacing of a final circuit arrangement;
removing the strings of LED packages from the lead frame structure; and
attaching the strings of LED packages to a circuit board wherein attaching the strings of LED packages to the circuit board comprises laminating the strings between an upper and a lower laminate sheet, and the upper laminate sheet is a perforated laminate sheet and perforations of the upper laminate sheet leave the LED packages exposed.

13. The method of claim 12 wherein attaching the LED packages to conductive wires comprises attaching the packages with solder or conductive epoxy.

14. The method of claim 13 wherein the LED packages are attached to the conductive wires with conductive epoxy, and wherein the method further comprises curing the epoxy.

15. The method of claim 12 wherein at least one of the upper laminate sheet and/or lower laminate sheet has a reflective surface.

16. The method of claim 12 further comprising cutting the strings of LED packages to a desired length prior to attaching them to a circuit board.

17. The method of claim 12 wherein the LED packages are from a common bin.

18. The method of claim 12 wherein the laminating is carried out with laminating rollers that have grooves or dimples so as not to damage the LED packages during the laminating.

* * * * *